(12) United States Patent
Messing et al.

(10) Patent No.: US 6,514,476 B1
(45) Date of Patent: Feb. 4, 2003

(54) ANISOTROPICALLY SHAPED SRTIO₃ SINGLE CRYSTAL PARTICLES

(75) Inventors: Gary L. Messing; Susan Trolier-McKinstry, both of State College, PA (US); Koji Watari, Aichi (JP)

(73) Assignee: Penn State Research Foundation, University Park, PA (US)

(*) Notice: Subject to any disclaimer, the term of this patent is extended or adjusted under 35 U.S.C. 154(b) by 0 days.

(21) Appl. No.: 09/558,049

(22) Filed: Apr. 26, 2000

Related U.S. Application Data (60) Provisional application No. 60/131,316, filed on Apr. 27, 1999.

(51) Int. Cl.⁷ .......................... C01G 23/00; C01F 1/00; C01F 11/00
(52) U.S. Cl. .................. 423/598; 117/73; 117/949; 264/650
(58) Field of Search .................. 423/598; 501/134, 501/136, 137; 117/73, 949; 264/650

(56) References Cited

U.S. PATENT DOCUMENTS

| | | | |
|---|---|---|---|
| 4,233,282 A | | 11/1980 | Arendt |
| 4,534,956 A | * | 8/1985 | Arendt et al. ............... 423/598 |
| 4,670,243 A | * | 6/1987 | Wilson et al. ............... 423/598 |
| 4,710,227 A | * | 12/1987 | Harley et al. ........... 106/193 R |
| 5,270,293 A | | 12/1993 | Schulze et al. |
| 5,374,330 A | * | 12/1994 | Douglas ..................... 156/635 |
| 5,795,537 A | | 8/1998 | Senna |
| 6,093,242 A | * | 7/2000 | Mckee et al. .................. 117/2 |
| 6,093,338 A | | 7/2000 | Tani et al. |

FOREIGN PATENT DOCUMENTS

| JP | 10-114570 | 5/1998 |
|---|---|---|

OTHER PUBLICATIONS

Arendt et al, "Lead Zirconate Titanate Ceramics from Molten Salt Synthesis Powders," Mater. Res. Bull., 14, 703–9 (1979), No month.

Brahmaroutu et al, Molten salt synthesis of anisotropc Sr2Nb2O7 particles, J. Am. Ceram. Soc, Jun., 1999, pp. 1565–1568.

Hirao et al., Processing Strategy for producing highly anisotropic silicon nitride, J. Am. Ceram. Soc.., Jun., 1995, pp. 1687–1690.

Hong et al, Development of textured mullite by templated grain growth, J. Am. Ceram. Soc, Apr., 1999, pp. 867–872.

Horn et al, Templated grain growth of textured bismuth titanate, J. Am. Ceram. Soc, Apr., 1999, pp. 921–926.

Kimera et al, Products of Reaction between PbO and Nb₂O₃ in Molten KCl and NaCl, Comm. An. Ceram. Soc, Oct., 1983, pp. C195–197.

Li et al, Heteroepitaxial growth of bulk single–crystal Pb(Mg₁/₃Nb₂/₃)O₃–32mol%PbTiO₃ from (111)SrTiO₃, J. Mater. Res., Aug., 1999, pp. 3189–3191.

Moon et al. "Oriented Lead Titanate Film Growth at Lower Temperatures by the Sol–Gel Method on Particle–Seeded Substrates," J. Am. Ceram. Soc., 80, 2613–23 (1997), No month.

Park et la, Ultrahigh stain and piezoelectric hevioir in relaxor based ferroelectric single crystals, J. Appl. Phyus. Aug. 15, 1997, p. 1804–11.

Ruddlesden et al. "The Compound Sr₃Ti₂O₇ and its Structure," Acta Cryst., 11, 54–55 (1958), No month.

Sacks et al, Fabrication of Textured silicon carbidevia seeded anisotropoc grain grwoth, J. Am. Ceram. Soc, Jun. 1996, pp. 1611–1616.

Seabaugh et al, "Texture Development by Templated Grain Growth in Liquid–phase–Sintered α–Alumina," J. Am. Ceram. Soc., 80, 1181–1188 (1997, No month.

Takeuchi et al, "Microcomposite Particles Sr₃Ti₂O₇–SrTiO₃ with an Epitaxial Core–shell Structure," Solid State Ionics, 108, 67–71 (1998), No month.

Watari et al., Epitaxial Growth of Anisotropically Shaped, Single–Crystal Particles of Cubic SrTiO₃, J. Mater. Res., vol. 15, No. R, Apr. 2000, pp. 846–849.

Arendt et al., The Molten Salt Synthesis of Large Crystal–Sized SrTiO₃ Ceramic Electrolyte Cells, vol. 134,No.3, pp. 733–736 (1987), no month.

Fukuchi et al, Oriented Bi₀.₅(Na, K)₀.₅TiO₃ Ceramics, J. Am. Cer. Soc., pp. 227–233, no date.

Takeuchi et al., Piezoelectric Properties of Bismuth Layer–Structured Ferroelectric Ceramics with a Preferred Orientation Processed by the Reactive Templated Grain Growth Method, Jpn. J. Appl. Phys. vol. 38(1999) pp. 5553–5556 Sep. 1999.

Takeuchi et al., Texture Engineering of Lead–containing Perovskite–type Ceramics by RTGG Method, Electronic Ceramics in Japan, vol. 4, no date.

Wang et al., Mechanochemical fabrication of single phase PMN of perovskite structure, Solid State Ionics 124 (1999), pp. 271–279, no month.

Duran, et al., Fabrication and Electrical Properties of Textured Sr₀.₅₃Ba₀.₄₇Nb₂O₆ Ceramics by Templated Grain Growth,, J. Am. Ceram. Soc. vol. 83, No. 9, pp. 2203–2213, no date.

Hong et al., Anisotropic Grain Growth in Seeded and B₂O₃–Doped Diphasic Mullite Gels, J. European Ceramic Society pp. 133–141 (1996), no month.

* cited by examiner

Primary Examiner—Steven Bos
(74) Attorney, Agent, or Firm—Law Offices of John A. Parrish (57) ABSTRACT

The disclosed invention relates to unsupported, anisotropically shaped, cubic SrTiO₃ single crystal particles and their method of manufacture. The particles have a rectangular face and measure about 10–40 micron in edge length, and about 2–5 micron in thickness. The anisotropically shaped, cubic SrTiO₃ single crystal particles are made by reacting tabular Sr₃Ti₂O₇ with TiO₂ in the presence of a molten alkali salt.

21 Claims, 6 Drawing Sheets

ANISOTROPICALLY SHAPED SRTIO₃ SINGLE CRYSTAL PARTICLES

This application claims priority to provisional application Ser. No. 60/131,316, filed Apr. 27, 1999.

FIELD OF THE INVENTION

The invention generally relates to ferroelectric single crystal materials. More particularly, the invention relates to $SrTiO_3$ single crystal materials.

BACKGROUND OF THE INVENTION

Polycrystalline ceramics and films which have preferred crystalline orientation exhibit unique and improved properties, e.g., piezoelectric, ferroelectric, mechanical, thermal, and magnetic properties compared to materials which have random crystalline orientation.

Various processing techniques have been used to fabricate polycrystalline ceramics and films which have preferred orientation. Examples of these techniques include templated grain growth, sol-gel processing, pulsed-laser deposition, and RF magnetron sputtering. To form oriented polycrystalline ceramics and films, the correct selection of the substrate material is critical, regardless of the processing technique. In general, single crystal seeds or substrates which have crystal structure and lattice parameters similar to the targeted materials are employed.

Anisotropically shaped single-crystal particles of materials which have a cubic crystal structure are of considerable interest due to potentially favorable properties of such materials. However, due to crystal symmetry, materials which have a cubic crystal structure typically grow as equiaxed crystals. Anisotropically shaped single crystal particles which have a cubic crystal structure thus have not been available.

A need therefore exists for anisotropically shaped single crystal particles which have a cubic crystal structure and which can serve as templates for growth of oriented crystalline ceramics and films such as those which have the perovskite crystal structure.

SUMMARY OF THE INVENTION

Unsupported, anisotropically shaped single-crystal particles of cubic $SrTiO_3$ are obtained by epitaxial growth on tabular tetragonal $Sr_3Ti_2O_7$. The micron size, anisotropically shaped $SrTiO_3$ single crystal particles have rectangular faces which measure about 10 micron to about 40 micron in edge length, and about 2 micron to about 5 micron thick. The aspect ratio of length to width of the particles may vary from about 1 to about 20.

The micron size anisotropically shaped $SrTiO_3$ particles are obtained by molten salt synthesis of tabular $Sr_3Ti_2O_7$ particles, followed by reaction of the tabular $Sr_3Ti_2O_7$ particles and $TiO_2$ in molten KCl. During the reaction, the anisotropically shaped single crystal $SrTiO_3$ forms on the surface of the tabular $Sr_2Ti_3O_7$. The single crystal $SrTiO_3$ particles form in an epitaxial relationship with the tabular $Sr_3Ti_2O_7$ wherein the [001] of $SrTiO_3$ is parallel to the [001] of $Sr_2Ti_3O_7$. Reaction of the tabular $Sr_3Ti_2O_7$ particles and $TiO_2$ in molten KCl is driven to completion to yield unsupported, anisotropically shaped $SrTiO_3$ particles.

The unsupported anisotropically shaped $SrTiO_3$ particles may be used to synthesize highly oriented ceramics and films having the perovskite crystal structure and having enhanced electrical properties.

In one aspect, the invention provides a method of manufacture of oriented, cubic $(Bi_{0.5}Na_{0.5})TiO_3$ grains. The method entails forming a mixture of $Na_2CO_3$, $Bi_2O_3$, $BaCO_3$, and $TiO_2$, preferably in the presence of a polar alcohol solvent to form a slurry. The mixture is combined with a binder, preferably in the presence of an organic solvent such as toluene to form a blend. Anisotropically shaped, single crystal $SrTiO_3$ platelets are added to the blend. The blend is cast, dried and fired produce oriented, cubic $(Bi_{0.5}Na_{0.5})TiO_3$. Preferably, firing is performe at about 1150–1250° C. for about 8 hours in oxygen.

In another aspect, the invention provides a method of manufacture of textured $BaTiO_3$. The method entails treating $BaTiO_3$ powder with a strong acid such as nitric acid, recovering the $BaTiO_3$ powder and washing the $BaTiO_3$ powder in a an alcohol such as isopropanol. The washed $BaTiO_3$ powder is dried, preferably at about 110° C. Thereafter, the $BaTiO_3$ powder is mixed with polymeric binder, preferably in the presence of an organic solvent such as toluene to form a slurry. The anisotropically shaped, single crystal $SrTiO_3$ platelets are then added. The resulting $SrTiO_3/BaTiO_3$ slurry is cast, heated to remove the polymeric binder, and sintered to yield of textured $BaTiO_3$. Preferably, sintering is performed at 1350–1370° C. for about 3 hours in air.

Having summarized the invention, the invention will now be discussed in detail below by reference to the following detailed description and non-limiting examples.

DETAILED DESCRIPTION OF THE INVENTION

Synthesis of Micron Size Tabular $Sr_3Ti_2O_7$ Particles

In manufacture of anisotropic single crystal $SrTiO_3$ as described below, $SrCO_3$, $TiO_2$, $Sr_3Ti_2O_7$, and salts such as KCl which are employed are about 99.9% pure. Generally, however, these reactants or precursors thereof can be of commercial or technical grade.

The reactant oxides or precursors employed typically have a particle size range from submicron up to about 100 microns. The reactant oxide powders or precursors thereof preferably are free of large, hard aggregates of about 100 microns or more in size.

Tabular $Sr_3Ti_2O_7$ particles measuring about 100 microns in length and about 10 microns in thickness, preferably about 10 microns to about 40 microns in length and about 2 microns to about 5 microns in thickness are produced. The aspect ratio may range from about 1 to about 20, preferably about 10.

In order to prepare the tabular $Sr_3Ti_2O_7$ particles, $SrCO_3$ and $TiO_2$ powders, each have a particle size of about 10 microns to about 1 microns, preferably about 1.0 microns, are mixed by ball milling with plastic ball media in a polar solvent such as ethanol, isopropanol, acetone, and methanol. The $SrCO_3$ and $TiO_2$ may be used in molar ratios of $SrCO_3::TiO_2$ of from about 3.0:2.0 to about 3.3:2.0, preferably about 3.2:2.0. Mixing is continued for a time sufficient to achieve a homogenous mixture, typically 8 hours. After completion of mixing, a salt is added to the slurry, and mixed for a time sufficient to achieve a homogenous mixture, typically about 3 hours. The salt is water soluble, has solubility for SrO and $TiO_2$, does not become incorporated into the crystals of the product phase is added to the slurry, and has low volatility. The amount of salt added is about 50% to about 150%, preferably 100% of the combined weight of the $SrCO_3$ and $TiO_2$ reactants. Examples of salts which may be employed include KCl, NaCl, and mixtures thereof, preferably KCl.

The above formed slurry is dried in air between about 25° C. to about 90° C., preferably about 85° C. The resulting dried powder is placed in a crucible such as alumina or platinum, preferably alumina. Preferably, an alumina lid is placed on top of the alumina crucible, and the edges of the lid are sealed with alumina cement to prevent evaporation of the salt. The powder in the sealed crucible is fired at about 1200° C. to about 1400° C., preferably 1300° C., for about 1 hour to about 8 hours, preferably about 4 hours. During firing, the heating rate is about 2° C./min to about 40° C./min., preferably 10° C./min. After completion of firing, the powder in the sealed crucible is cooled to room temperature at the rate of about 1° C./min to about 100° C./min., preferably about 3–5° C./min. The resulting tabular $Sr_3Ti_2O_7$ particles are washed with deionized water at a temperature of about 25° C. to about 99° C., preferably about 90° C., to remove about 98% or more of the salt, preferably about 99.9% or more of the salt.

Synthesis of Epitaxially Grown Tabular $SrTiO_3$ Particles

The tabular $Sr_3Ti_2O_7$ particles produced as described above may be employed in a wide range of sizes and aspect ratios for reaction with $TiO_2$ to produce anisotropically shaped, single crystal $SrTiO_3$. Any polymorph of $TiO_2$ may be used, preferably, fumed $TiO_2$.

The tabular $Sr_3Ti_2O_7$ particles are combined with $TiO_2$, preferably in a polar solvent such as ethanol to produce a slurry. The amounts of $Sr_3Ti_2O_7$ and $TiO_2$ are sufficient to yield a molar ratio of $Sr_3Ti_2O_7$ to $TiO_2$ of about 1:1 to about 1:1.3, preferably about 1.0:1.1. The slurry is mixed by a magnetic stirrer for about 0.5 hour to about 10 hour, preferably about 1 hour. After completion of mixing, a water soluble salt that has solubility for SrO and $TiO_2$, has low volatility, and does not become incorporated into the crystals of the product phase is mixed with the $Sr_3Ti_2O_7$ and $TiO_2$. Preferably, the salt is added to a slurry of the $Sr_3Ti_2O_7$ to $TiO_2$. Examples of useful salts include KCl, NaCl or mixtures thereof, preferably KCl. The amount of salt added is about 50% to about 150%, preferably about 100%, of the combined weight of $Sr_3Ti_2O_7$ and $TiO_2$.

The resulting slurry of $Sr_3Ti_2O_7$, $TiO_2$ and salt is dried at about 25° C. to about 75° C., preferably about 65° C., for about 1 hour to about 10 hours, preferably about 5 hours. The resulting dried powder is fired at a heating rate of about 1° C./min to about 40° C./min, preferably about 10° C./min, in an alumina crucible, preferably a covered alumina crucible, to about 700° C to about 1400° C., preferably about 1200° C., for about 60 to about 480 minutes, preferably about 240 min. After completion of firing, the powder in the crucible is cooled to room temperature at about 1° C./min to about 40° C./min., preferably about 5° C./min. The salt is removed from the fired product by washing with deionized water at a temperature of about 25° C. to about 90° C., preferably about 90° C., to remove about 98% or more of the KCl, preferably about 99.9% or more of the KCl.

The anisotropically shaped, single crystal $SrTiO_3$ forms on the surface of the tabular $Sr_3Ti_2O_7$ particles by epitaxial growth. To enable epitaxial growth, the lattice mis-match between the $Sr_3Ti_2O_7$ substrate and the growing $SrTiO_3$ typically is less than about 15%. Preferably, the difference in lattice parameters between the $SrTiO_3$ and the substrate is as small as possible.

EXAMPLES

Example 1

Tabular $Sr_3Ti_2O_7$ particles are prepared by ball milling $SrCO_3$ and $TiO_2$ powders with plastic ball media in ethanol. The $SrCO_3$ and $TiO_2$ are used in a molar ratio of $SrCO_3::TiO_2$ of 3.2:2.0. Mixing is continued for 8 hours. After completion of mixing, KCl in an amount equal to the combined weight of $SrCO_3$ and $TiO_2$ is added to the slurry, and mixed for 3 hours.

The resulting slurry is dried in air at 65° C. for 5 hours. The resulting dried powder is sealed in an alumina crucible and fired at 1300° C. 4 hours. During firing, the heating rate is 10° C./min. After completion of firing, the powder in the sealed crucible is cooled to room temperature at the rate of 3–5° C./min.

Figure 1:
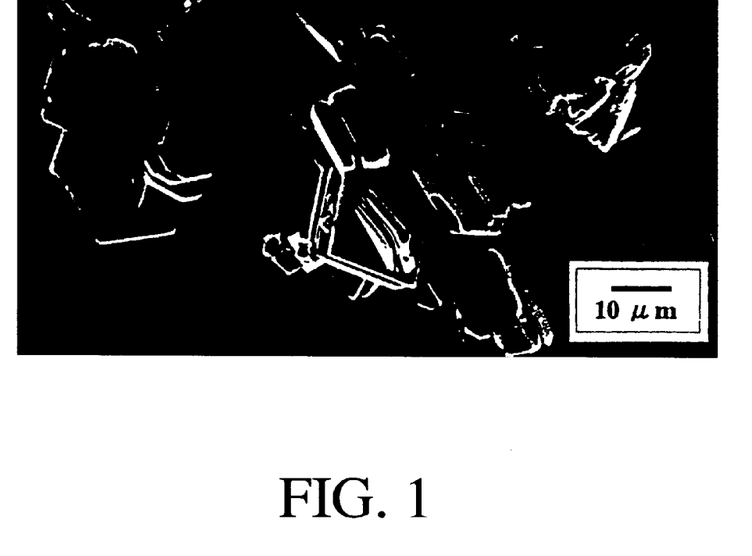
FIG. 1 is a scanning electron micrograph of tabular $Sr_3Ti_2O_7$ particles synthesized from reaction of $SrCO_3$ and $TiO_2$ in KCl at 1300° C. for 4 hours.
Figure 2:
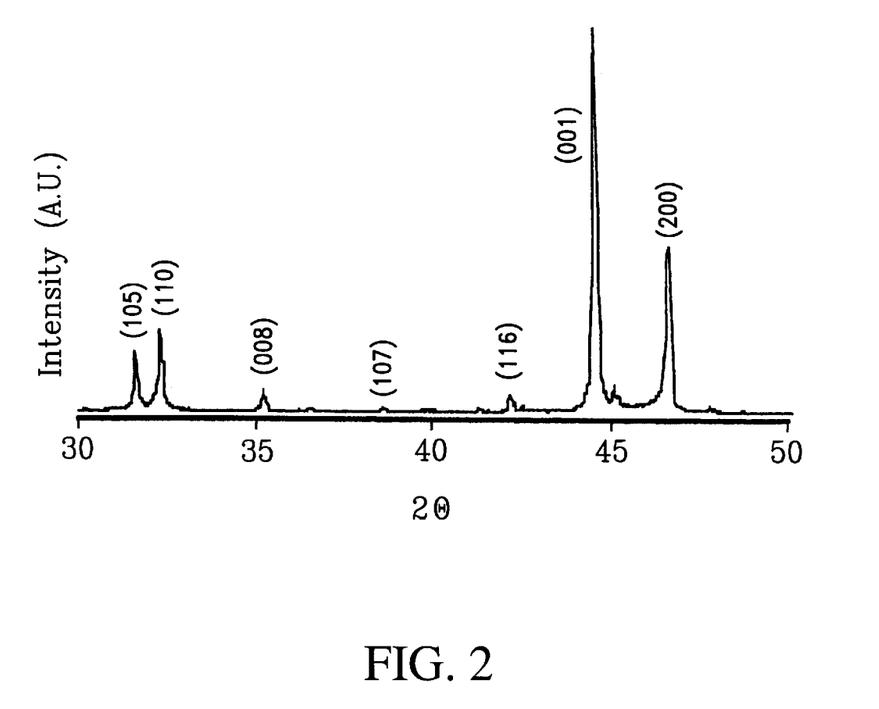
FIG. 2 is an x-ray diffraction pattern of the tabular $Sr_3Ti_2O_7$ particles of FIG. 1.
Figures 3A, 3B:
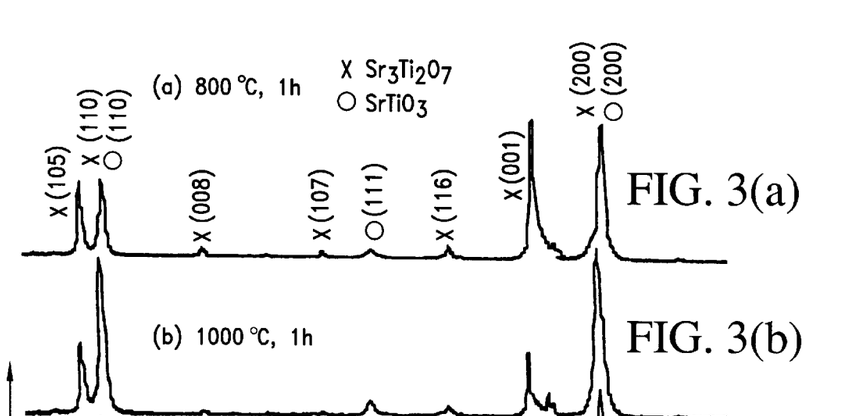
FIGS. 3(a)–(d) are x-ray diffraction patterns of $SrTiO_3$ formed on the tabular $Sr_3Ti_2O_7$ particles of FIG. 1 by reaction of $Sr_3Ti_2O_7$ particles and $TiO_2$ in KCl at various firing temperatures.
Figure 3C:
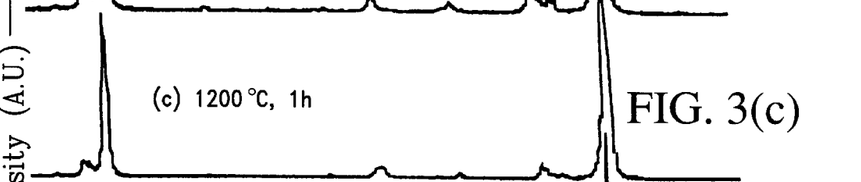
Figure 3D:
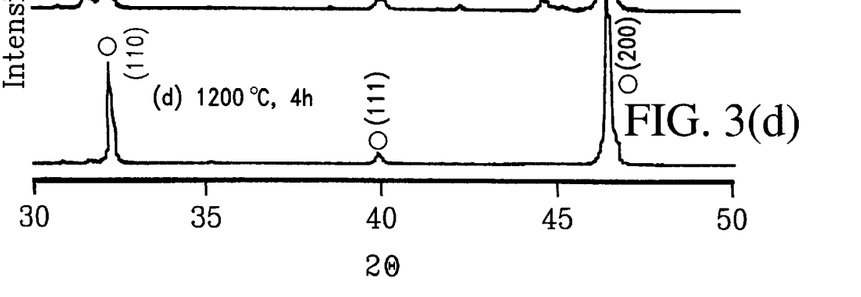

The tabular $Sr_3Ti_2O_7$ particles are separated from the resulting solidified mass by repeated washing with deionized water at 90° C. to dissolve the KCl. Washing is repeated to remove 99.9% or more of the KCl. The tabular $Sr_3Ti_2O_7$ particles measure 8–18 micron edge length and 2–5 micron thickness as shown in FIG. 1. The tabular $Sr_3Ti_2O_7$ particles have enhanced (001) peak intensity as shown in the X-ray diffraction pattern of FIG. 2 as taken by Scintag diffractometer using CuKα radiation. The developed plane of the $Sr_3Ti_2O_7$ particles corresponds to the {001} plane of $Sr_3Ti_2O_7$. The lattice parameters of the a and c-axis of the $Sr_3Ti_2O_7$ particles are 0.3899 and 2.0328 nm respectively.

The tabular $Sr_3Ti_2O_7$ particles produced above are mixed with $TiO_2$ in a 1.0:1.1 molar ratio in ethanol by a magnetic stirrer for 1 hour. KCl in an amount equal to the combined weight of the $Sr_3Ti_2O_7$ particles and $TiO_2$ is added to the slurry. The slurry then is dried at 65° C. for 5 hours. The resulting dried powder is placed in a covered alumina crucible and fired at the heating rate of 10° C./min to 1200° C., and maintained at 1200° C. for 4 hour. After firing, the powder is cooled at 5° C./min to room temperature. The reaction between $Sr_3Ti_2O_7$ and $TiO_2$ in the KCl goes to completion under these conditions to yield a fired product that includes anisotropically shaped, single crystal $SrTiO_3$ in the molten KCl. The fired product is cooled to room temperature, and treated with deionized water at 90° C. to remove the KCl salt to yield unsupported, anisotropically shaped, single crystal $SrTiO_3$ particles.

Example 2

The procedure of example 1 is repeated except that the mixture of tabular $Sr_3Ti_2O_7$ particles and $TiO_2$ is heated at 1200° C. for 1 hour.

Example 3

The procedure of example 1 is repeated except that the mixture of tabular $Sr_3Ti_2O_7$ particles and $TiO_2$ is heated at 1000° C. for one hour.

Example 4

The procedure of example 1 is repeated except that the mixture of tabular $Sr_3Ti_2O_7$ particles and $TiO_2$ is heated at 800° C. for one hour.

The x-ray diffraction patterns of the anisotropically shaped, single crystal $SrTiO_3$ formed according to the above examples is shown in FIGS. 3(a)–(d). As shown therein, the $SrTiO_3$ diffraction peak heights increase with increasing firing temperature. FIGS. 3(a)–(d) show that between 1000° C. and 1200° C. that $SrTiO_3$ forms rapidly. In addition, FIGS. 3(a)–(d) show that the lattice parameters of the tabular $Sr_3Ti_2O_7$ and the anisotropically shaped, single crystal $SrTiO_3$ are stable over a wide range of temperatures as shown in Table 1.

TABLE 1

| Example | Firing Conditions | $Sr_3Ti_2O_7$ a (nm) | $Sr_3Ti_2O_7$ b (nm) | $SrTiO_3$ a(=b=c) (nm) |
|---|---|---|---|---|
| 1 | 1200° C. for 4 hours | — | — | 0.3905 ± 0.0003 |
| 2 | 1200° C. for 1 hour | 0.3908 ± 0.0013 | 2.0295 ± 0.0054 | 0.3905 ± 0.0003 |
| 3 | 1000° C. for 1 hour | 0.3899 ± 0.0002 | 2.0341 ± 0.0009 | 0.3904 ± 0.0003 |
| 4 | 800° C. for 1 hour | 0.3899 ± 0.0002 | 2.0344 ± 0.0008 | 0.3904 ± 0.0001 |

Figure 4A:
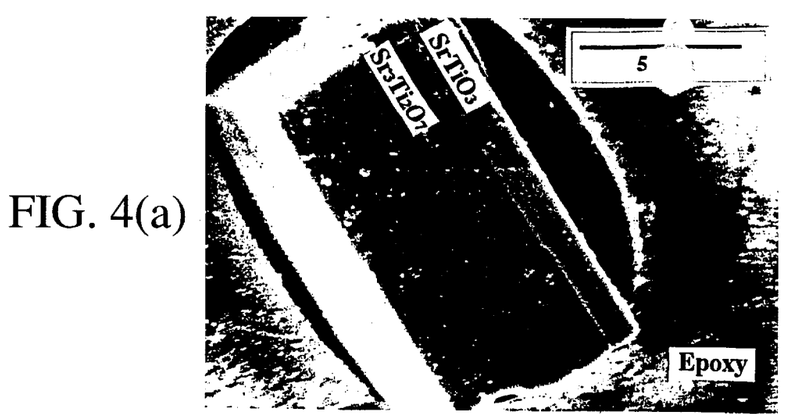
FIGS. 4(a)–(c) are micrographs of $SrTiO_3$ film formed on the surface of the tabular $Sr_3Ti_2O_7$ particles of FIG. 1 by reaction of $Sr_3Ti_2O_7$ particles and $TiO_2$ in KCl at various firing temperatures.
Figure 4B:
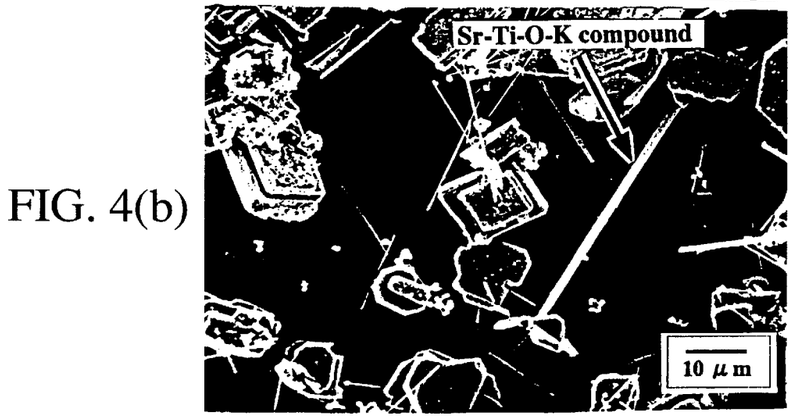
Figure 4C:
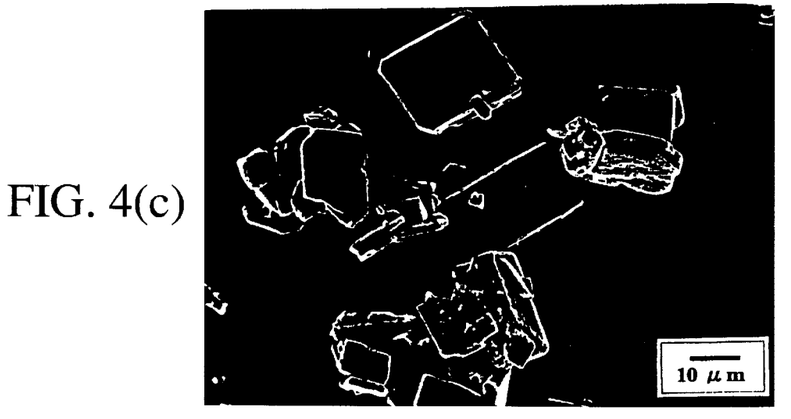

Anisotropically shaped, single crystal $SrTiO_3$, as shown in FIG. 4(a), forms during the initial stage of the reaction of Example 3 on the surface of the tabular $Sr_3Ti_2O_7$ particles. When fired as in Example 2, whiskers in the Sr—Ti—K—O system (FIG. 4 (b)), and acicular $TiO_2$ form. The whiskers and the acicular $TiO_2$ are identified by scanning electron microscopy and energy-dispersive X-ray analysis. The micrograph of FIG. 4(a) was obtained by embedding of the $Sr_3Ti_2O_7$ particles in epoxy and polishing.

When fired at 1200° C. for 4 hours as in Example 1, the whiskers disappear, and anisotropically shaped, single crystal $SrTiO_3$ particles having 10–20 micron edge length and 2 micron thickness are formed as shown in FIG. 4(b). XRD shows strong peak intensity of the (200) reflection (FIG. 3(d)). This shows that anisotropically shaped, single crystal $SrTiO_3$ particles develop their major faces parallel to the (001) plane of $SrTiO_3$. The measured lattice parameter of the a-axis of the anisotropically shaped, single crystal $SrTiO_3$ particles having the cubic, perovskite crystal structure is 0.3905 nm.

A 200 kV cold field emission Hitachi HF-2000 transmission electron microscope is used to evaluate the orientation relationship between the growing layer of the anisotropically shaped, single crystal $SrTiO_3$ and the $Sr_3Ti_2O_7$ template particles.

The epitaxial relationship between the formed $SrTiO_3$ and the tabular $Sr_3Ti_2O_7$ particles is confirmed by high resolution lattice imaging of the interface of $SrTiO_3$—$Sr_3Ti_2O_7$ product and from electron diffraction patterns of selected areas of the $SrTiO_3$–$Sr_3Ti_2O_7$ product.

Figure 5A:
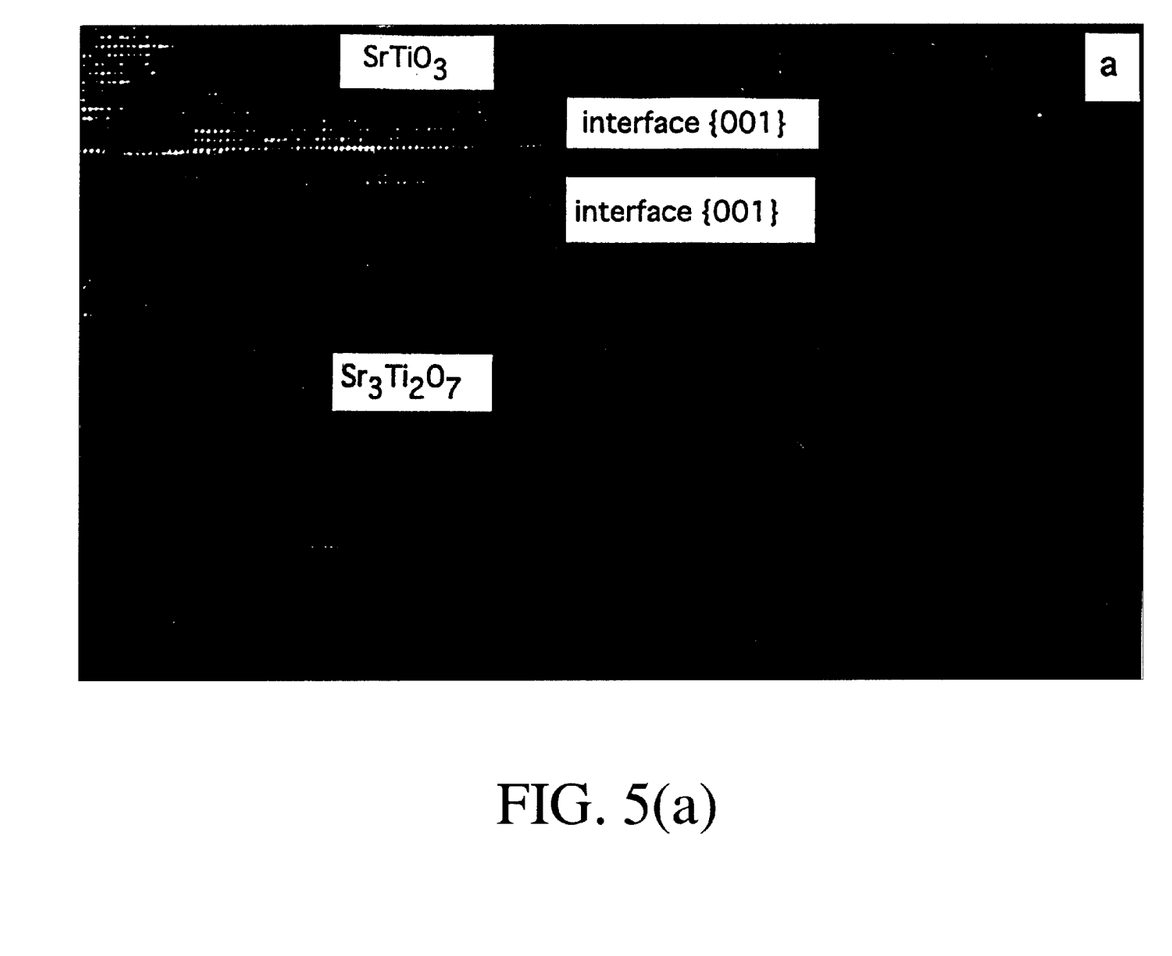
FIGS. 5(a)–(c) are high resolution lattice images of $SrTiO_3$ film formed on the surface of the tabular $Sr_3Ti_2O_7$ particles of FIG. 1 when reacted with $TiO_2$ in KCl at 1000° C. for 1 hour.

The high resolution lattice image of the interface between the anisotropically shaped, single crystal $SrTiO_3$ growing on the $Sr_3Ti_2O_7$ (FIG. 5(a)) is taken with the incident electron beam parallel to the [110] direction. FIG. 5(a) shows that the interface plane between the growing the anisotropically shaped, single crystal $SrTiO_3$ and the $Sr_3Ti_2O_7$ substrate is parallel to the {001} plane of the lattice structure of the anisotropically shaped, single crystal $SrTiO_3$ and $Sr_3Ti_2O_7$, and is perpendicular to the [001] direction of the tetragonal $Sr_3Ti_2O_7$. FIG. 5a also shows that the interface between the growing, anisotropically shaped, single crystal $SrTiO_3$ and $Sr_3Ti_2O_7$ is abrupt and is free of secondary phase formation.

Figure 5B:
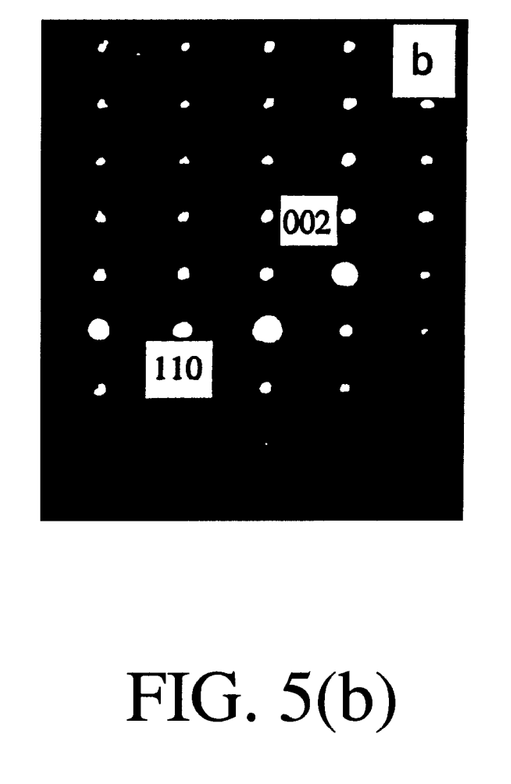
Figure 5C:
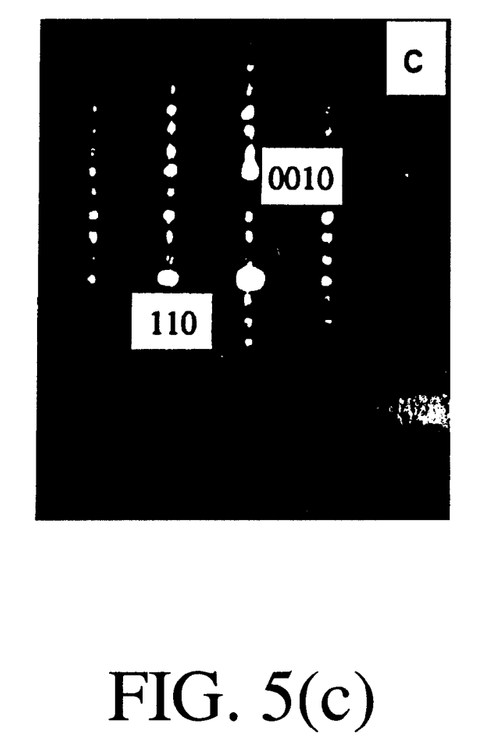

FIGS. 5(b) and (c) are electron diffraction patterns taken of the growing the anisotropically shaped, single crystal $SrTiO_3$ and the $Sr_3Ti_2O_7$ tabular particle in the corresponding area near the interface. FIGS. 5(b) and (c) show that the [110] of the growing $SrTiO_3$ is parallel to the [110] of $Sr_3Ti_2O_7$ and that [001] of the growing $SrTiO_3$ is parallel to the [001] of $Sr_3Ti_2O_7$. This confirms that anisotropically shaped, single crystal $SrTiO_3$ forms epitaxially on the c plane of the tabular $Sr_3Ti_2O_7$ particles.

Tabular $Sr_3Ti_2O_7$ having a layered perovskite-type structure is the preferred substrate for use in the manufacture of anisotrogically shaped, single crystal $SrTiO_3$ having the perovskite crystal structure. The tabular $Sr_3Ti_2O_7$ particles have a Ruddlesden-Popper type structure, and lattice parameters of a=0.390 and c=2.038 nm. The lattice structure on the {001} plane of $Sr_3Ti_2O_7$ is similar to that on the {100} plane of $SrTiO_3$, and the lattice parameters on those planes are equal (0.390 nm). Materials other than tabular $Sr_3Ti_2O_7$ which may be used as substrates include those which have a perovskite structure, or cubic materials which are anisotropic in shape. Examples of these materials include $BaTiO_3$, $Bi_4Ti_3O_{12}$, $PbTiO_3$ and MgO.

The stability of the anisotropically shaped, single crystal $SrTiO_3$ particles produced above is evaluated by placing the anisotropically shaped, single crystal $SrTiO_3$ particles on a platinum sheet and firing at 1200° C. for 60 minutes in air. The morphology of the anisotropically shaped, single crystal $SrTiO_3$ particles, as determined by scanning electron microscopy, did not change significantly.

The anisotropically shaped, single crystal $SrTiO_3$ particles having the perovskite single crystal structure produced by the invention advantageously may be employed to achieve significant improvements in electrical materials. For example, these $SrTiO_3$ particles may be used as templates for deposition of oriented films of materials such as ceramics, metals, and composites.

The anisotropically shaped, cubic, single-crystal $SrTiO_3$ particles of the invention may be used as templates to make oriented polycrystalline ceramics from a variety of ferroelectric materials such as $(Bi_{0.5}Na_{0.5})TiO_3$, $BaTiO_3$, and $SrTiO_3$. The anisotropically shaped, single crystal $SrTiO_3$ particles of the invention also may be used to produce grain-oriented polycrystalline ceramics which have a cubic, perovskite-type crystal structure and which exhibit single crystal-like properties. These uses of the anisotropically shaped, cubic single crystal $SrTiO_3$ particles is illustrated below by the following non-limiting examples:

Examples 5–7

Oriented, Cubic $(Bi_{0.5}Na_{0.5})TiO_3$ grains on Anisotropic, Cubic $SrTiO_3$ Particles 2.09 gms $Na_2CO_3$, 9.17 gms $Bi_2O_3$, 0.90 gms $BaCO_3$, and 6.66 gms $TiO_2$ are milled in isopropyl alcohol using plastic ball media for 8 hours. The resulting slurry is dried at 65° C. for 5 hours to produce a dried powder. The dried powder is fired at 800° C. for 2 hours. The fired material is ball milled in isopropyl alcohol using $ZrO_2$ ball media for 8 hours. The resulting milled powder is blended with 8 gms Ferro acrylic binder system 73210 and milled in toluene with $ZrO_2$ ball media for 24 hours. The resulting slurry is placed into a beaker to which 1.1 gms of the anisotropically shaped, single crystal $SrTiO_3$ platelets produced as in Example 1 above are added and then mixed for 12 hours with a magnetic stirrer to disperse the $SrTiO_3$ particles in the slurry. The slurry is tape cast onto a glass substrate using a commercially available doctor blade with a gap of 200 microns at 5 cm/sec to produce a thickness of 50 micron. The tape is dried at 25° C. to remove volatiles. The tape is cut into squares, stacked and laminated under a pressure of 4000 psi to produce a laminate. After binder burnout at 600° C., the laminate is sintered at 1200° C. for 8 hours in oxygen. Scanning electron microscopy and X-ray diffraction show that oriented, $(Bi_{0.5}Na_{0.5})TiO_3$ having a cubic, perovskite crystal structure forms on the $SrTiO_3$ particles.

Example 6

Example 5 is Repeated Except that the Laminate is Sintered at 1150° C.

Example 7

Example 5 is Repeated Except that the Laminate is Sintered at 1250° C.

Example 8

Textured $BaTiO_3$ using Anisotropically Shaped, Single Crystal $SrTiO_3$ Particles $BaTiO_3$ powder (Cabot BT16) is dispersed in an $HNO_3$ aqueous solution (pH=2) for 30 min. This procedure is performed twice. The $BaTiO_3$ powder is recovered and then washed in isopropanol and centrifuged. Washing in isopropanol and centrifuging is repeated five times. The $BaTiO_3$ powder is dried at 110° C. 15.00 gms of the dried $BaTiO_3$ powder is roll-milled with $ZrO_2$ media in 5 gms of toluene for 5 hours to form a slurry. 8.85 gms of (73210) polymeric binder from Ferro Corporation is added to the $BaTiO_3$ powder in the slurry, and the resulting mixture is roll-milled for 10 hours. The milled $BaTiO_3$-binder slurry is poured into a 100 ml Pyrex beaker equipped with a magnetic stir bar. 1.42 gms of the anisotropically shaped, single crystal $SrTiO_3$ platelets produced as in Example 1 above are added to the milled $BaTiO_3$-binder slurry and mixed for 5 hours in the Pyrex beaker. The resulting mixed $SrTiO_3/BaTiO_3$ slurry is tape cast onto a glass substrate using a doctor blade opening of 200 micron at 5 cm/sec to achieve a thickness of 200 micron. The tape is dried at room temperature to remove volatiles, and the dried tape is cut into 1 cm squares. Twenty of the squares are stacked and laminated at room temperature under a pressure of 7000 psi. The resulting laminate is heated in air at 0.5° C./min. to a temperature of 650° C., and held at 650° C. for 1 hour to remove the polymeric binder. The resulting laminate is then sintered 1350–1370° C. for 3 hours in air.

X-ray diffraction (XRD) of the face of the fired, laminated squares shows preferential orientation of the $BaTiO_3$ in the <001> crystallographic direction. XRD also shows an approximate 50% fiber-texture in the <001> direction perpendicular to the face of the fired, laminated squares.

What is claimed is:

1. An unsupported, anisotropically shaped, cubic $SrTiO_3$ single crystal particle.

2. The anisotropically shaped, cubic $SrTiO_3$ single crystal particle of claim 1 wherein the particle has a rectangular face measuring about 10 micron to about 40 micron in edge length, and about 2 micron to about 5 micron in thickness.

3. The anisotropically shaped, cubic $SrTiO_3$ single crystal particle of claim 2 wherein the particle has an aspect ratio of edge length to width of about 1 to about 20.

4. The anisotropically shaped, cubic $SrTiO_3$ single crystal particle of claim 2 wherein the cubic $SrTiO_3$ single crystal has a lattice parameter a=0.3905±0.0003.

5. The anisotropically shaped, single crystal $SrTiO_3$ particle of claim 2 wherein the rectangular face measures about 10–20 micron edge length and about 2 micron thickness.

6. A method of manufacture of unsupported, anisotropically shaped $SrTiO_3$ particles comprising, reacting $SrCO_3$ and $TiO_7$ in a first molten alkali metal salt to produce tabular $SrTi_2O_7$ particles, reacting the tabular $Sr_3Ti_2O_7$ particles with $TiO_3$ in the presence of a second molten alkali metal salt to produce a fired product that includes anisotropically shaped, single crystal $SrTiO_3$.

cooling the fired product to a temperature below the melting point of the second alkali metal salt, and treating the fired product with water to remove the second alkali metal salt to yield unsupported, anisotropically shaped, single crystal $SrTiO_3$ particles.

7. The method of claim 6 wherein the first molten alkali metal salt is selected from the group consisting of KCl, NaCl and mixtures thereof, and the second molten alkali metal salt is selected from the group consisting of KCl, NaCl and mixtures thereof.

8. The method of claim 7 wherein the first molten alkali metal salt is KCl and the second alkali metal salt is KCl.

9. The method of claim 7 wherein the water is deionized water having a temperature of about 90° C.

10. The method of claim 9 wherein the $TiO_2$ reacted with the $Sr_3Ti_2O_7$ particles is fumed $TiO_2$.

11. The method of claim 10 wherein $Sr_3Ti_2O_7$ and $TiO_2$ are present in a molar ratio of $Sr_3Ti_2O_7$ to $TiO_2$ of about 1:1 to about 1:1.3.

12. The method of claim 10 wherein $Sr_3Ti_2O_7$ and $TiO_2$ are present in a molar ratio of $Sr_3Ti_2O_7$ to $TiO_2$ of about 1:1 to about 1.0:1.1.

13. The method of claim 10 wherein the second alkali metal salt added is about 50% to about 100% of the combined weight of $Sr_3Ti_2O_7$ and $TiO_2$.

14. The method of claim 13 wherein the salt added is about 100% of the combined weight of $Sr_3Ti_2O_7$ and $TiO_2$.

15. The method of claim 14 wherein the reacting of the $Sr_3Ti_2O_7$, and $TiO_2$ in the presence of the second salt is performed at about 700° C. to about 1400° C., for about 60 to about 480 minutes.

16. The method of claim 15 wherein the reacting is performed at about 1200° C. for about 240 min.

17. A method of manufacture of oriented, cubic $(Bi_{0.5}Na_{0.5})TiO_3$ grains comprising, forming a slurry of $Na_2CO_3$, $Bi_2O_3$, $BaCO_3$, and $TiO_2$ in a polar alcohol solvent, drying the slurry to produce a dried powder firing the dried powder at 800° C., mixing the dried powder with a binder, anisotropically shaped, single crystal $SrTiO_3$ platelets, and an organic solvent to form a second slurry casting the second slurry onto a substrate to produce a tape, drying the tape to produce a dried tape, and firing the dried tape to produce oriented, cubic $(Bi_{0.5}Na_{0.5})TiO_3$.

18. The method of claim 17 wherein the firing of the dried tape is performed at 1150–1250° C. for about 8 hours in oxygen.

19. A method of manufacture of textured $BaTiO_3$ comprising, forming a mixture of $BaTiO_3$ powder and acid, washing the $BaTiO_3$ powder, drying the $BaTiO_3$ powder, forming a slurry of the dried $BaTiO_3$ powder, organic solvent polymeric binder and anisotropically shaped, single crystal $SrTiO_3$ platelets to produce a $SrTiO_3$/$BaTiO_3$ slurry, forming a tape of the $SrTiO_3$/$BaTiO_3$ slurry, heating the tape to remove the polymeric binder, and sintering the tape.

20. The method of claim 19 wherein the sintering of the tape is performed at 1350–1370° C. for 3 hours in air.

21. The method of claim 17 wherein the organic solvent is toluene.

* * * * *

UNITED STATES PATENT AND TRADEMARK OFFICE
CERTIFICATE OF CORRECTION

PATENT NO.   : 6,514,476 B1
DATED        : February 4, 2003
INVENTOR(S)  : Messing et al.

It is certified that error appears in the above-identified patent and that said Letters Patent is hereby corrected as shown below:

Column 1,
Line 6, insert:
-- This invention was made with support from the Government under Grant/Contract No. N00014-94-1-0007. The Government has certain rights in the invention. --.

Signed and Sealed this

Tenth Day of January, 2006

JON W. DUDAS
*Director of the United States Patent and Trademark Office*